United States Patent [19]

Badyal

[11] Patent Number: 5,534,815
[45] Date of Patent: Jul. 9, 1996

[54] SWITCHING CIRCUIT FOR SIGNAL SAMPLING WITH REDUCED RESIDUAL CHARGE EFFECTS

[75] Inventor: Rajeev Badyal, Fort Collins, Colo.

[73] Assignee: Hewlett-Packard Company, Palo Alto, Calif.

[21] Appl. No.: 282,941

[22] Filed: Jul. 29, 1994

[51] Int. Cl.$^6$ .................................................. H03K 17/687
[52] U.S. Cl. ........................ 327/437; 327/91; 327/382; 327/404
[58] Field of Search ........................... 327/91, 94, 96, 327/108, 111, 404, 427, 437, 337, 379, 382, 374, 376, 377, 391

[56] References Cited

U.S. PATENT DOCUMENTS

| | | | |
|---|---|---|---|
| 4,344,050 | 8/1982 | Callahan | 327/404 |
| 4,393,351 | 7/1983 | Gregorian et al. | 327/337 |
| 4,473,761 | 9/1984 | Peterson | 327/437 |
| 4,611,135 | 9/1986 | Nakayama et al. | 327/391 |
| 4,656,661 | 4/1987 | Carbrey | 327/91 |
| 4,714,843 | 12/1987 | Smith | 327/91 |
| 4,894,620 | 1/1990 | Nagaraj | 327/337 |
| 5,065,057 | 11/1991 | Kawassaki | 327/437 |
| 5,111,072 | 5/1992 | Seildel | 327/94 |
| 5,113,090 | 5/1992 | Imaizumi et al. | 327/91 |
| 5,148,054 | 9/1992 | Demler | 327/91 |
| 5,293,169 | 3/1994 | Baumgartner et al. | 341/172 |

OTHER PUBLICATIONS

S. D. Willingham, K. W. Martin. "Effective Clock-Feedthrough Reduction In Switched Capacitor Circuits", 1990 IEEE International Symposium On Circuits And Systems, vol. 4, pp. 2821–2824.

H. C. Yang, T. S. Fiez, D. J. Allstot, "Current Feedthrough Effects and Cancellation Techniques In Switched–Current Circuits", 1990 IEEE International Symposium On Circuits and Systems, vol. 4, pp. 3186–3188,1990.

*Primary Examiner*—Timothy P. Callahan
*Assistant Examiner*—My-Trang Nu Ton
*Attorney, Agent, or Firm*—Augustus W. Winfield

[57] ABSTRACT

An electronic switch for sampling a signal. A small switch is placed in parallel with a large switch. The large switch is opened first. Any residual charge from the large switch is compensated by a low impedance path through the small switch. Speed is maximized by providing high current capacity through the large switch. Noise is minimized by leaving only residual charge from the small switch. Example embodiments are provided for sampling both voltage and current signals.

6 Claims, 11 Drawing Sheets

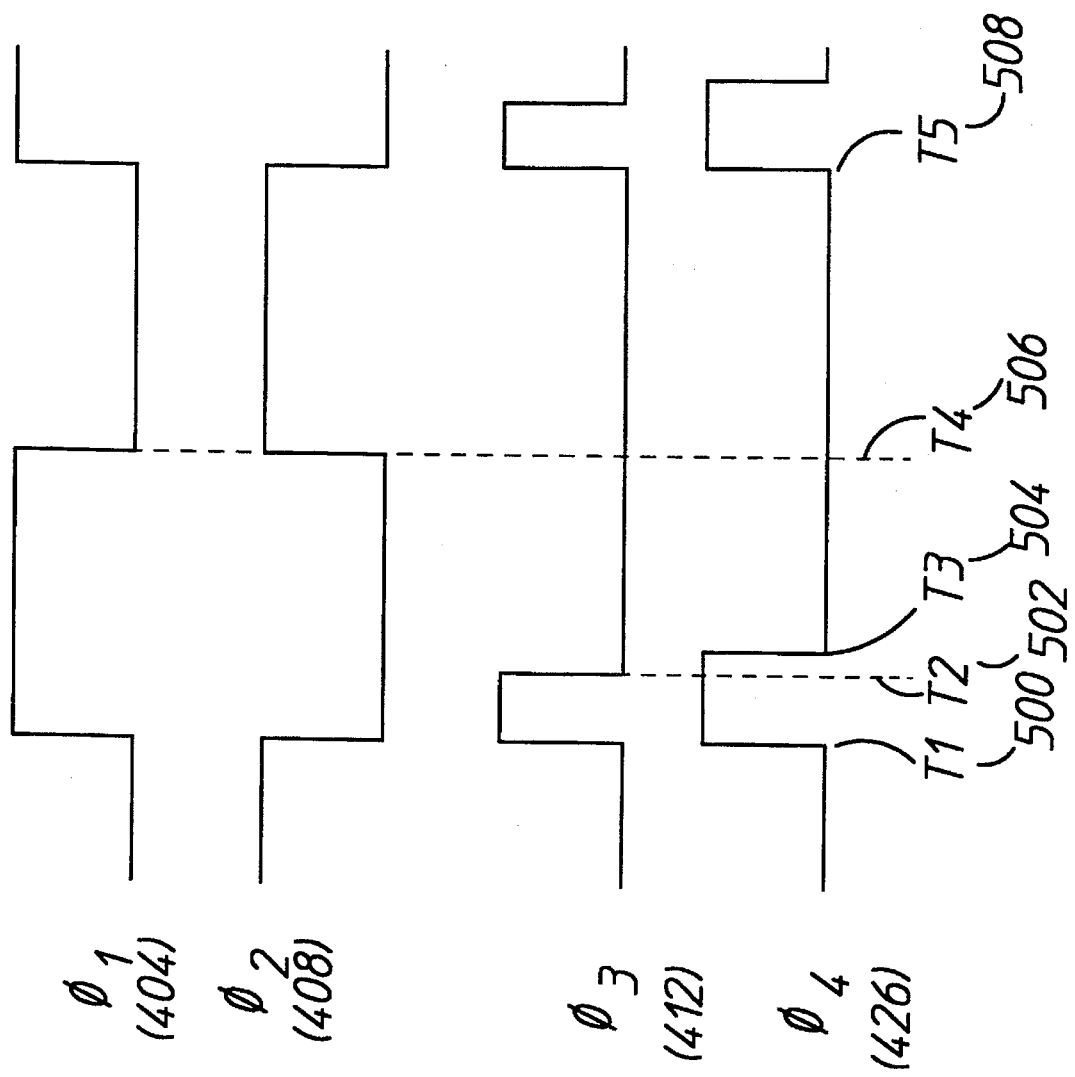

SWITCHING CIRCUIT FOR SIGNAL SAMPLING WITH REDUCED RESIDUAL CHARGE EFFECTS

FIELD OF INVENTION

This invention relates generally to electronic switches and more specifically to reduction of noise due to capacitance in switches for sampling analog signals.

BACKGROUND OF THE INVENTION

Many electronic circuits such as sample-and-hold circuits, analog-to-digital converters, delay lines, and switched-capacitor circuits require precision sampling of analog signals. Whether the circuit is sampling a voltage signal or a current signal, a critical part of the process often requires charging a sample capacitor to provide temporary storage of a voltage. A conducting field effect transistor has some unavoidable charge in the channel between the source and the drain. When a field-effect transistor switch is opened, half of the channel charge must transfer through the source terminal and half through the drain terminal. If a field effect transistor is used as the switch for signal sampling, the resulting charge on the sample capacitor is contaminated by channel charge within the switching transistor, adding noise to the sampled signal. The noise is sometimes referred to as clock feedthrough noise. As a first order improvement, some of the channel charge of the switch can be canceled by various "dummy" switch arrangements. Dummy switch arrangements cancel some charge but not enough for some high precision applications. For applications requiring additional precision, a feedback amplifier arrangement may be used to hold the voltage on the capacitor to a more accurate value after the switch is opened. Amplifier arrangements typically reduce the overall response time of the switching circuit. A switch design is needed that provides improved precision while maintaining fast switching.

SUMMARY OF THE INVENTION

The present invention provides a precision switching circuit with improved charge compensation and fast switching. In essence, a small switch is placed in parallel with a large switch. The large switch is turned off first. Uncompensated charge from the large switch is then compensated by a low impedance path through the small switch. After adequate charge compensation has occurred, the small switch is turned off. The resulting overall switch circuit has high speed as a result of the high current capacity of the large switch and small residual charge as a result of the smaller uncompensated charge from the small switch. A first embodiment provides a voltage sampling switch. A second embodiment provides a current sampling switch.

BRIEF DESCRIPTION OF THE DRAWINGS

FIG. 5C is a timing diagram of various switching signals in FIG. 5B.

DETAILED DESCRIPTION OF THE PREFERRED EMBODIMENT OF THE INVENTION

Figure 1A:
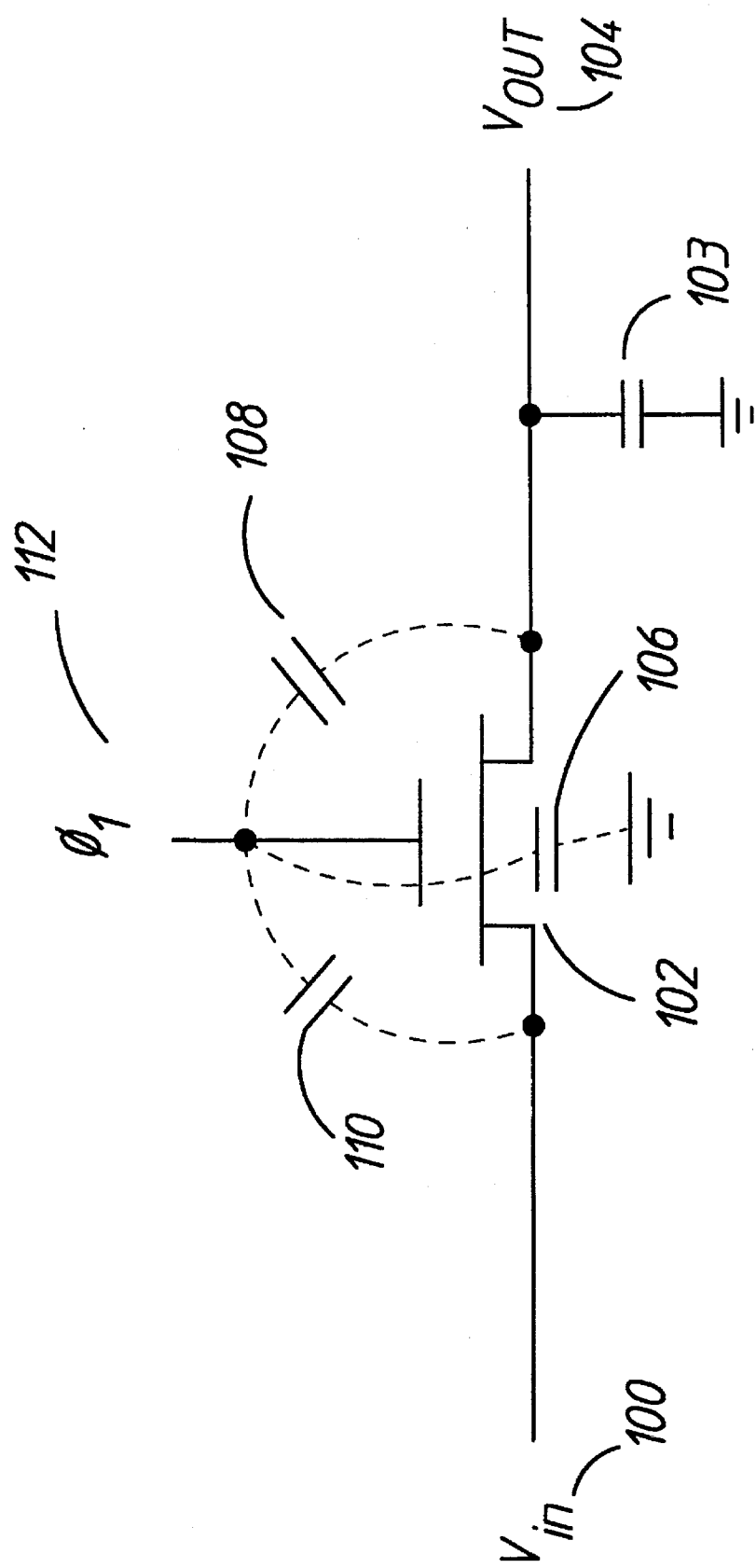
FIG. 1A is a schematic of a basic field effect transistor circuit for sampling voltage signals.

FIG. 1A illustrates a simple voltage sampling circuit. When the electronic switch 102 is in a conducting state, capacitor 103 is charged to the input voltage 100. When switch 102 is in a non-conducting state, output 104 remains at the voltage left on capacitor 103. Ideally, the sampled voltage 104 is precisely equal to the input voltage 100 at the time switch 102 switches from a conducting state to a non-conducting state. If switch 102 is a field effect transistor as illustrated, there are small parasitic capacitances 106, 108 and 110 from gate to bulk, gate to source and gate to drain. For field effect transistors, the primary parasitic capacitance of concern is the channel capacitance 106 from gate to bulk. When switch 102 switches from a conducting state to a non-conducting state, charge from these parasitic capacitances may contaminate the charge on capacitor 103, adding noise to the sampled voltage 104.

Figure 1B:
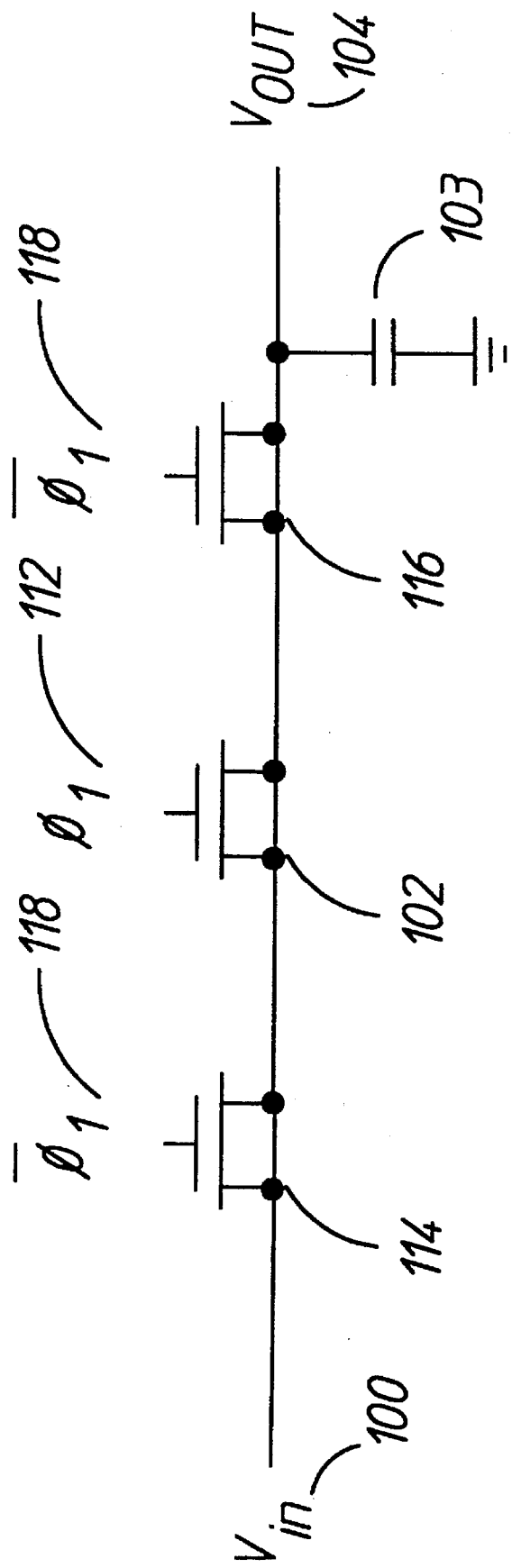
FIG. 1B is a schematic of the circuit of FIG. 1A with dummy switches for partial charge cancellation.

FIG. 1B illustrates the voltage sampling circuit of FIG. 1A with additional circuitry providing first order cancellation of parasitic capacitances. When switch 102 switches from a conducting state to a non-conducting state, half the parasitic capacitance remains on the source conductor and half on the drain conductor. In FIG. 1B, transistors 114 and 116 are half the size of transistor 102 and the gate voltage 118 for transistors 114 and 116 is the complement of the gate voltage 112 for transistor 102. Transistors 114 and 116 are dummy switches in that their sources and drains are shorted. When transistor 102 switches off, transistors 114 and 116 switch on. Charges on the half sized transistors 114 and 116 partially cancel the charges remaining on the source and drain of transistor 102. If the signal being sampled (100) approximates an ideal voltage source (low impedance), then dummy transistor 114 is not necessary.

Figure 1C:
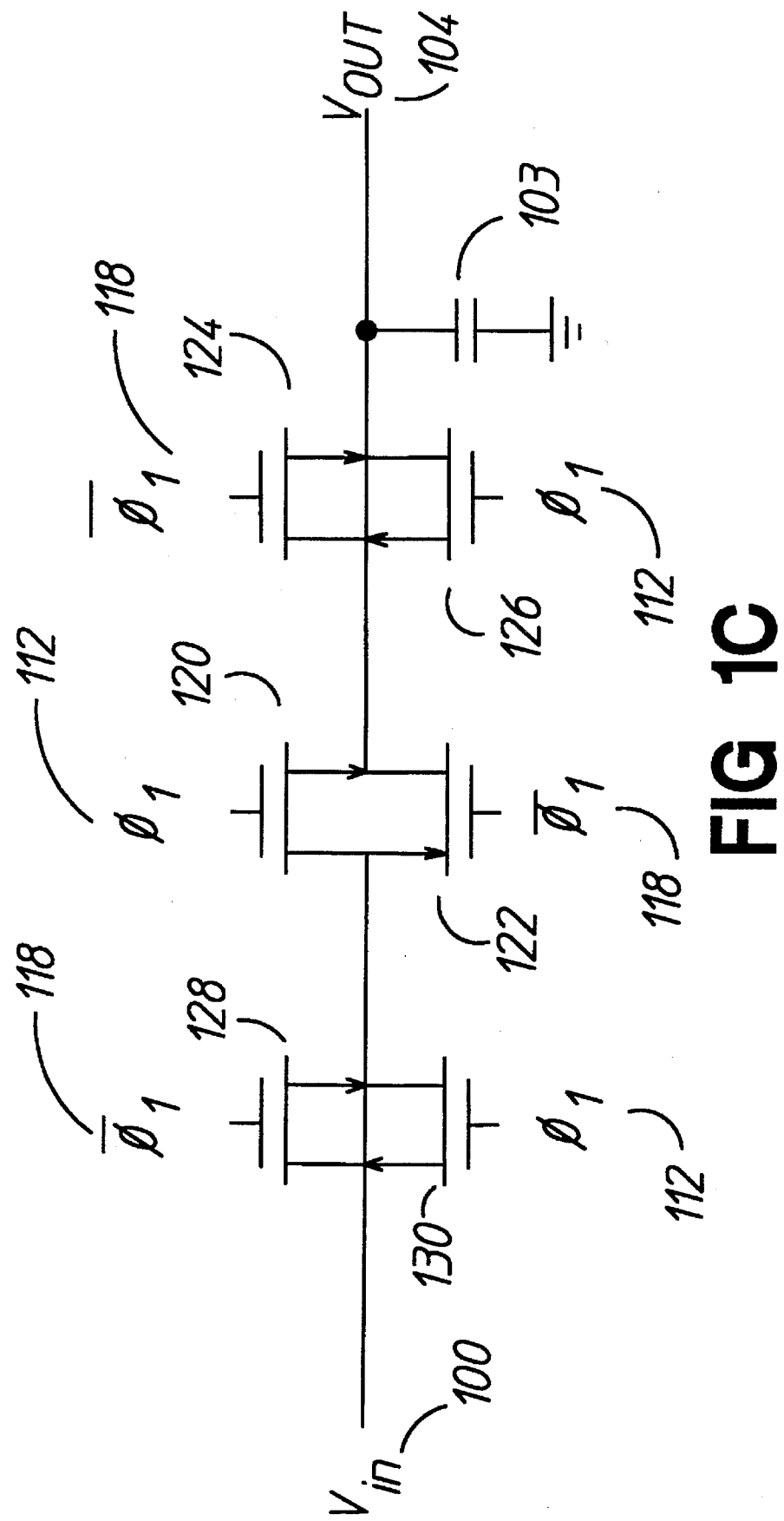
FIG. 1C is a schematic of the circuit of FIG. 1A with more elaborate dummy switch arrangements for partial charge cancellation.

FIG. 1C illustrates the voltage sampling circuits of FIGS. 1A and 1B with additional circuitry for compensation for parasitic capacitances. In FIG. 1C, the functional switch comprises two complementary transistors, an N-channel MOS transistor 120 and a P-channel MOS transistor 122, connected in parallel. Gate control voltages 112 and 118 are complementary so that transistors 120 and 122 turn on simultaneously and turn off simultaneously. Because the voltages on the gates of devices 120 and 122 are of opposite polarity, almost equal amounts of charge are pulled from and dumped onto line 104 and capacitor 103. Dummy switch transistors 124, 126, 128 and 130 are half the size of transistors 120 and 122. Charges that are not cancelled by complementary transistors 120 and 122 are partially cancelled by dummy transistor pairs (124, 126) and (128, 130). If the signal being sampled (100) approximates an ideal voltage source (low impedance), then dummy transistors 128 and 130 are not necessary.

The partial cancellations provided by the circuitry of FIGS. 1B and 1C are adequate for first order compensation, but in general, because of normal process variations, charge cancellation is never perfect. In addition, in the charge cancellation circuits illustrated in FIGS. 1B and 1C, charges from gate to source capacitance and gate to drain capacitance (capacitors 108 and 110 in FIG. 1A) are partially compensated but not charges from gate to bulk capacitance (capacitor 106 in FIG. 1A). For greater sampling accuracy, additional compensation is required. Also, for speed, switches need to be physically large to enable high currents when the switches are on, but physically large switches also have higher parasitic capacitance. Therefore, with charge compensation as illustrated in FIGS. 1B and 1C, there is some trade-off between speed and accuracy.

Figure 2A:
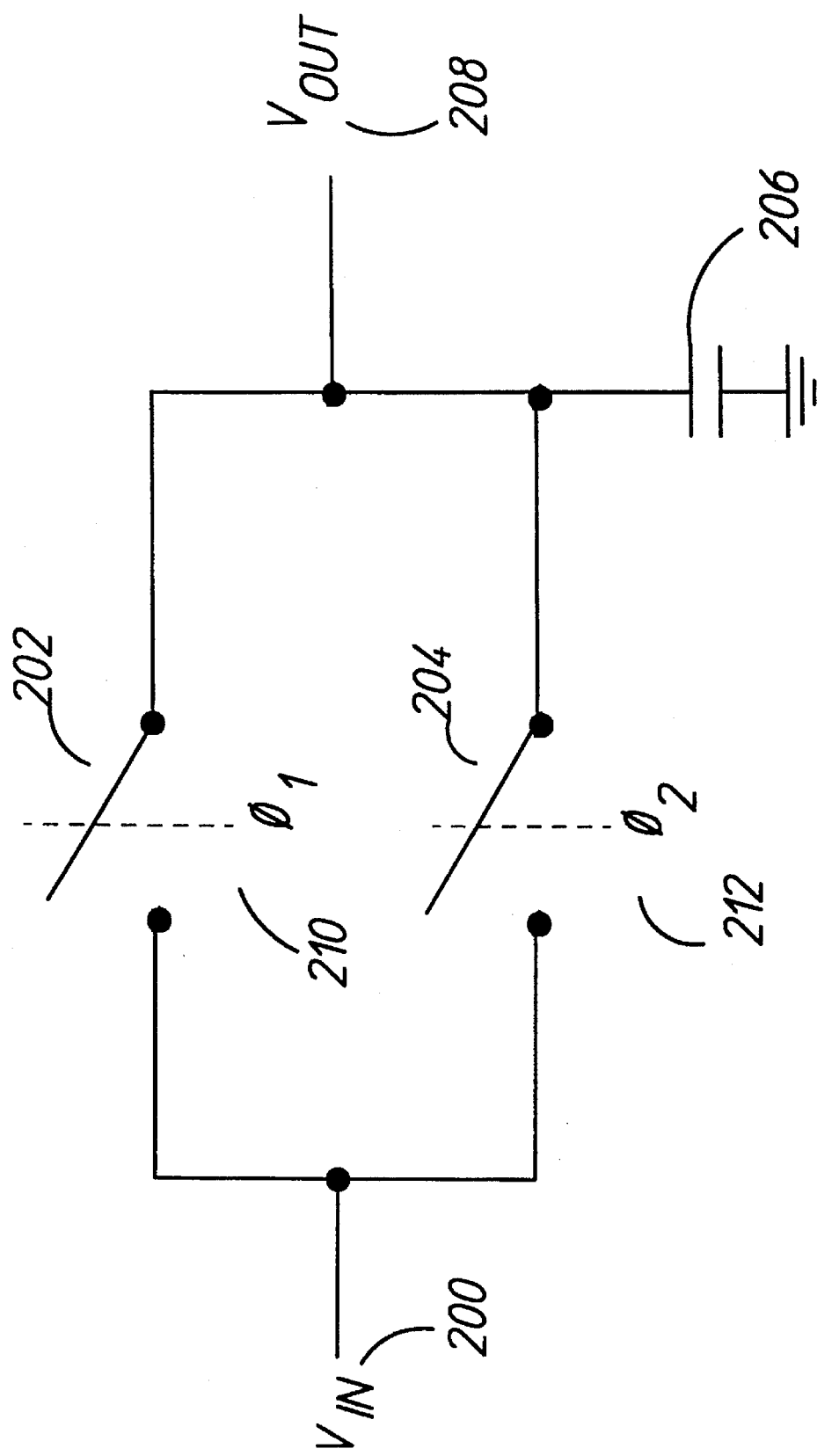
FIG. 2A is a simplified schematic of a dual switch arrangement for voltage signal sampling in accordance with the present invention.

FIG. 2A illustrates a voltage switching circuit in accordance with the present invention. FIG. 2A illustrates a voltage sampling circuit having two parallel switches 202 and 204. When either switch 202 or 204 is closed, capacitor 206 is charged toward the input voltage 200. When both switches 202 and 204 are open, the sampled voltage 208 is the voltage remaining on capacitor 206. Switch 202 is much larger than switch 204. Switch 204 is opened after switch 202 is opened. The larger switch 202 provides high current for fast sampling rates and the smaller switch 202 provides additional precision by reducing the residual charge after both switches are opened.

Figure 2B:
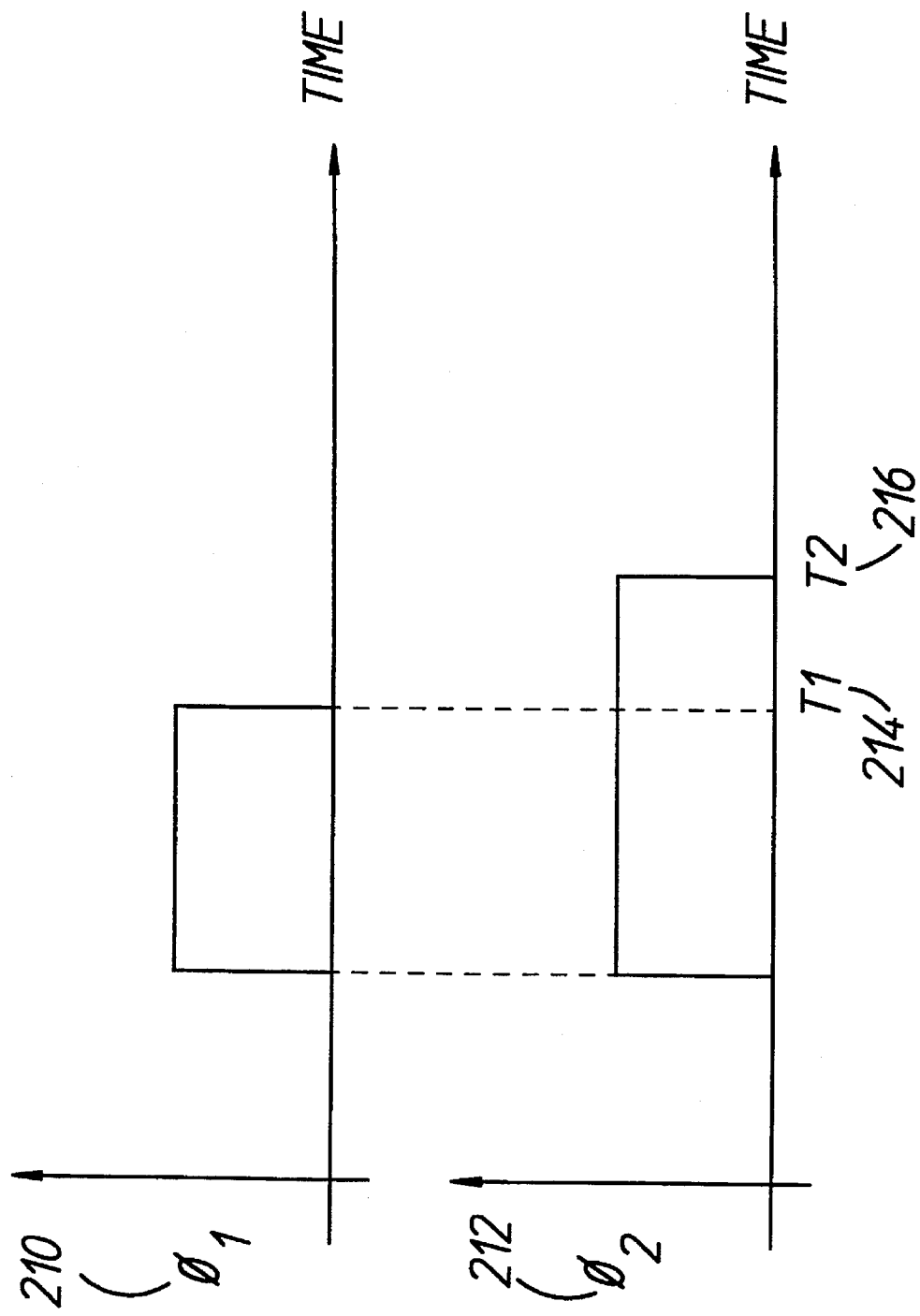
FIG. 2B is a timing diagram for the switching circuit illustrated in FIG. 2A.

FIG. 2B illustrates timing for the switch control signals 210 and 212. It is not necessary for the two switches 202 and 204 to turn on simultaneously but it is essential for charge compensation for the larger switch 202 to turn off earlier than the smaller switch 204. Assume, for example, that switch 202 is ten times larger than switch 204 and that switch 202 opens at time T1 (214). When switch 202 opens, some uncompensated charge remains to potentially contaminate the voltage on capacitor 206 but switch 204 still provides a low impedance to the input voltage 200. Therefore, the smaller switch 204 maintains capacitor 206 at the input voltage 200, dissipating any residual charge from the larger switch 202. If the smaller switch 204 is one-tenth the size of the larger switch 202, then the residual charge from switch 204 at time T2 (216) is on the order of one-tenth the residual charge from switch 202. The speed of the circuit (current capability for charging capacitor 206) is determined by the area of the larger switch 202 and the sample noise (residual charge after opening) is determined by the area of the smaller switch 204.

Figure 3:
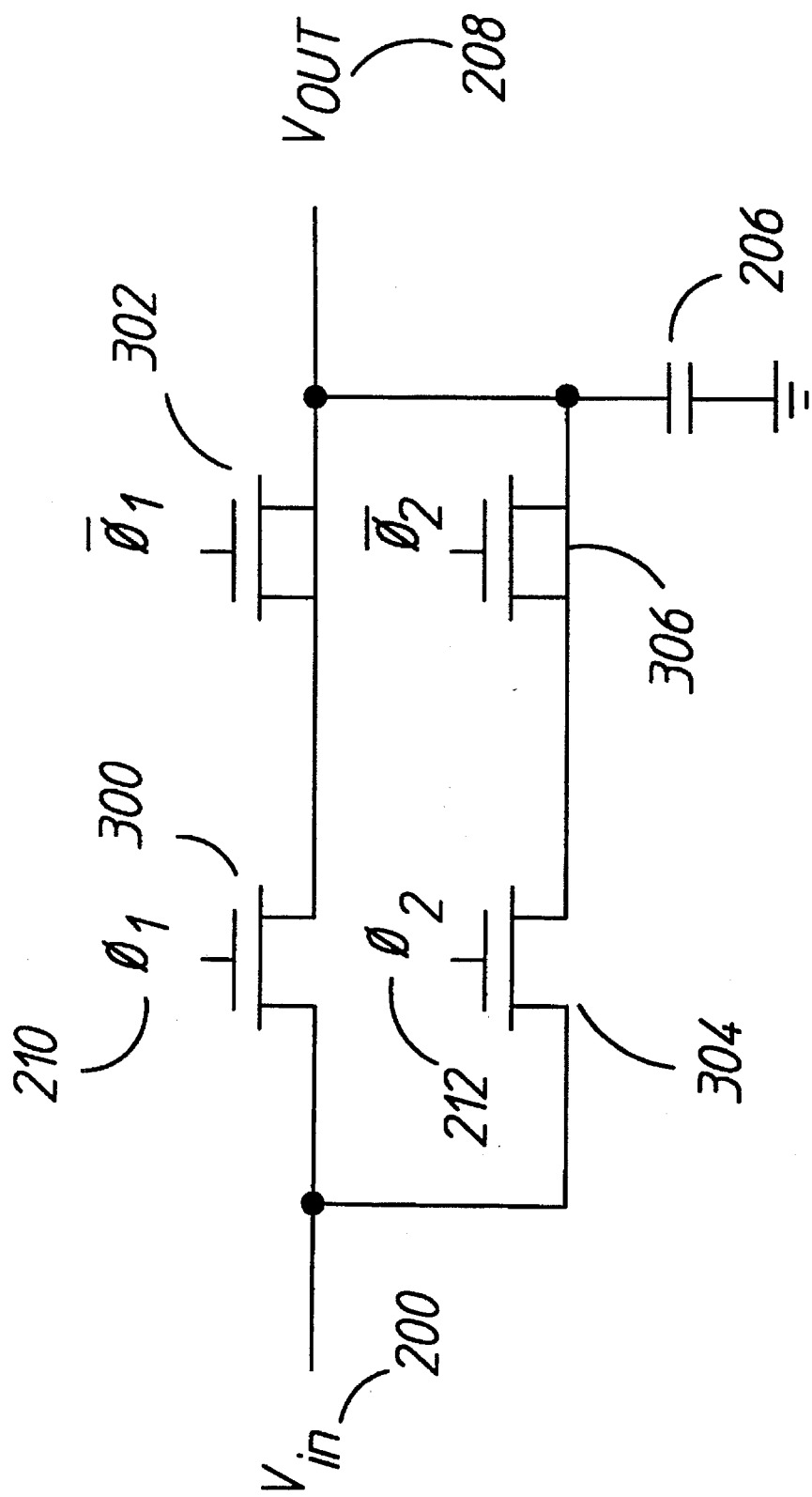
FIG. 3 is a schematic of an example embodiment of the switching circuit illustrated in FIG. 2A.

Switches 202 and 204 in FIG. 2B may be single transistors as illustrated in FIG. 1A or transistor circuits with various charge cancellation circuitry as illustrated in FIGS. 1B and 1C. For any charge cancellation circuitry, there is some non-cancelled charge and the non-cancelled charge may be further reduced by a smaller parallel switch arrangement as illustrated in FIG. 2A. FIG. 3 illustrates an example embodiment using the parallel switch arrangement of FIG. 2A combined with the charge cancellation arrangement of FIG. 1B. In FIG. 3, a large switching transistor 300 is followed by a dummy transistor 302, where the dummy transistor 302 is half the size of transistor 300. In a parallel path, switching transistor 304 is followed by dummy transistor 306, where the dummy transistor 306 is half the size of transistor 304. Transistor 300 is much larger than transistor 304. As in FIG. 2B, transistors 300 and 304 initially conduct simultaneously, and transistor 300 turns off before transistor 304. Dummy transistor 302 turns on when transistor 300 turns off and dummy transistor 306 turns on when transistor 304 turns off. Dummy transistor 302 partially cancels residual charge from the relatively large transistor 300. Transistor 304 provides a low impedance path for compensation of any residual charge from transistors 300 and 302. Dummy transistor 306 partially cancels residual charge from the relatively small transistor 304.

Figure 4A:
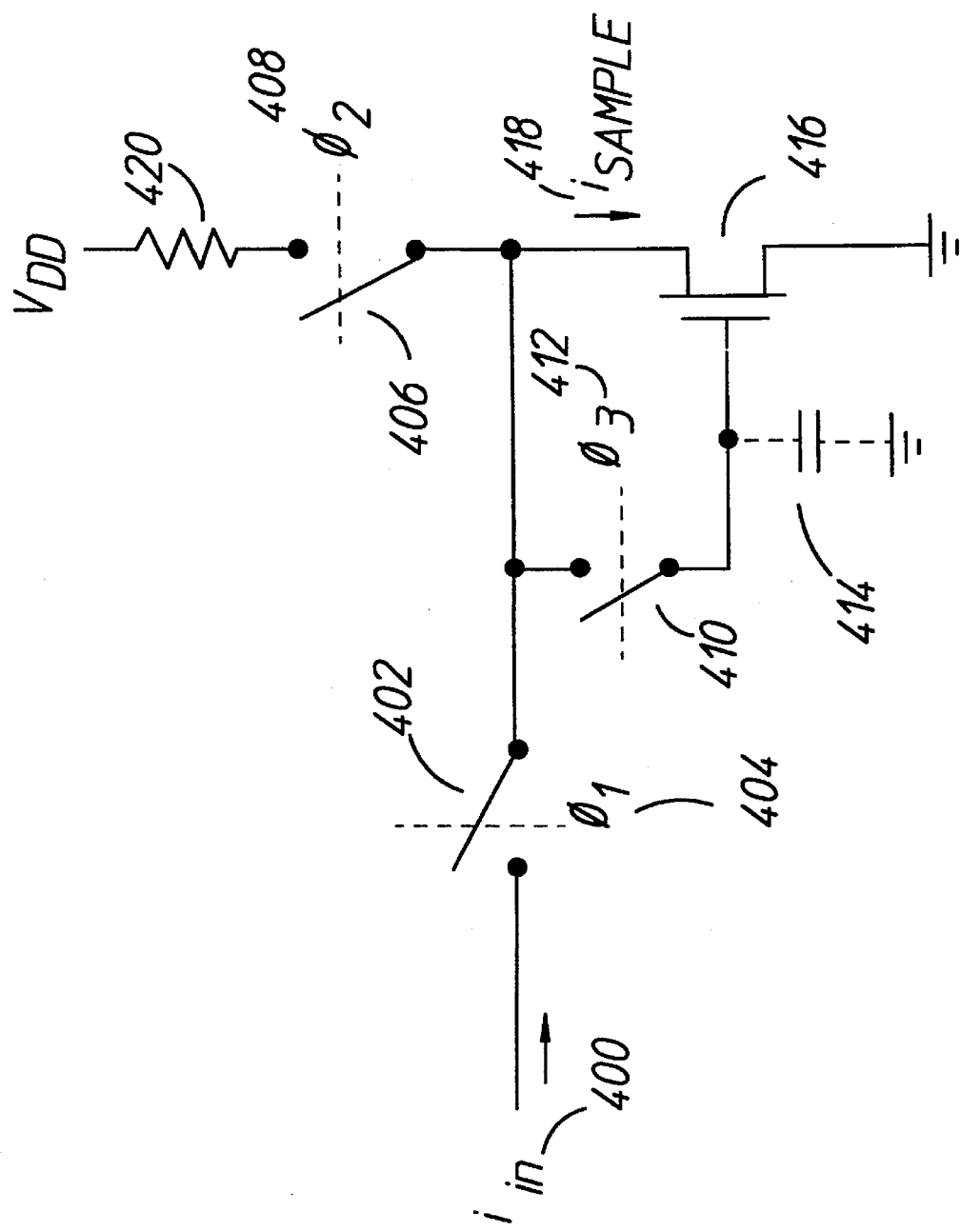
FIG. 4A is a simplified schematic of a switching circuit for current signal sampling.

For high speed, circuits such as analog-to-digital conversion circuits are often operated in a low impedance current signal mode rather than in a voltage signal mode. FIG. 4A illustrates a circuit for sampling or copying a current signal. In FIG. 4A, switches 402 and 410 are initially closed and switch 408 is open. Gate capacitance 414 charges to a voltage that permits a current signal 400 to flow through a controlled current sink (transistor 416). Switch 410 is then opened, leaving a stored charge on the gate capacitance 414. Switch 402 is then opened and switch 408 is closed, causing input current 400 to cease to flow through the current sink (transistor 416). The gate voltage for transistor 416, resulting from stored charge on the gate capacitance 414, permits flow of a current (equal to the input current 400) through the load resistor 420 through switch 408 and transistor 416. As in the discussion of FIG. 1A, residual charge from switch 410 may contaminate the charge stored on gate capacitance 414, causing the current through the load resistor 420 to be slightly different than the original input current 400. Residual charge on switch 410 can be partially cancelled by the techniques illustrated in FIGS. 1B and 1C. Residual charge can be reduced further by the parallel switch technique illustrated in FIGS. 2A and 2B and at a higher sampling speed.

Figure 4B:
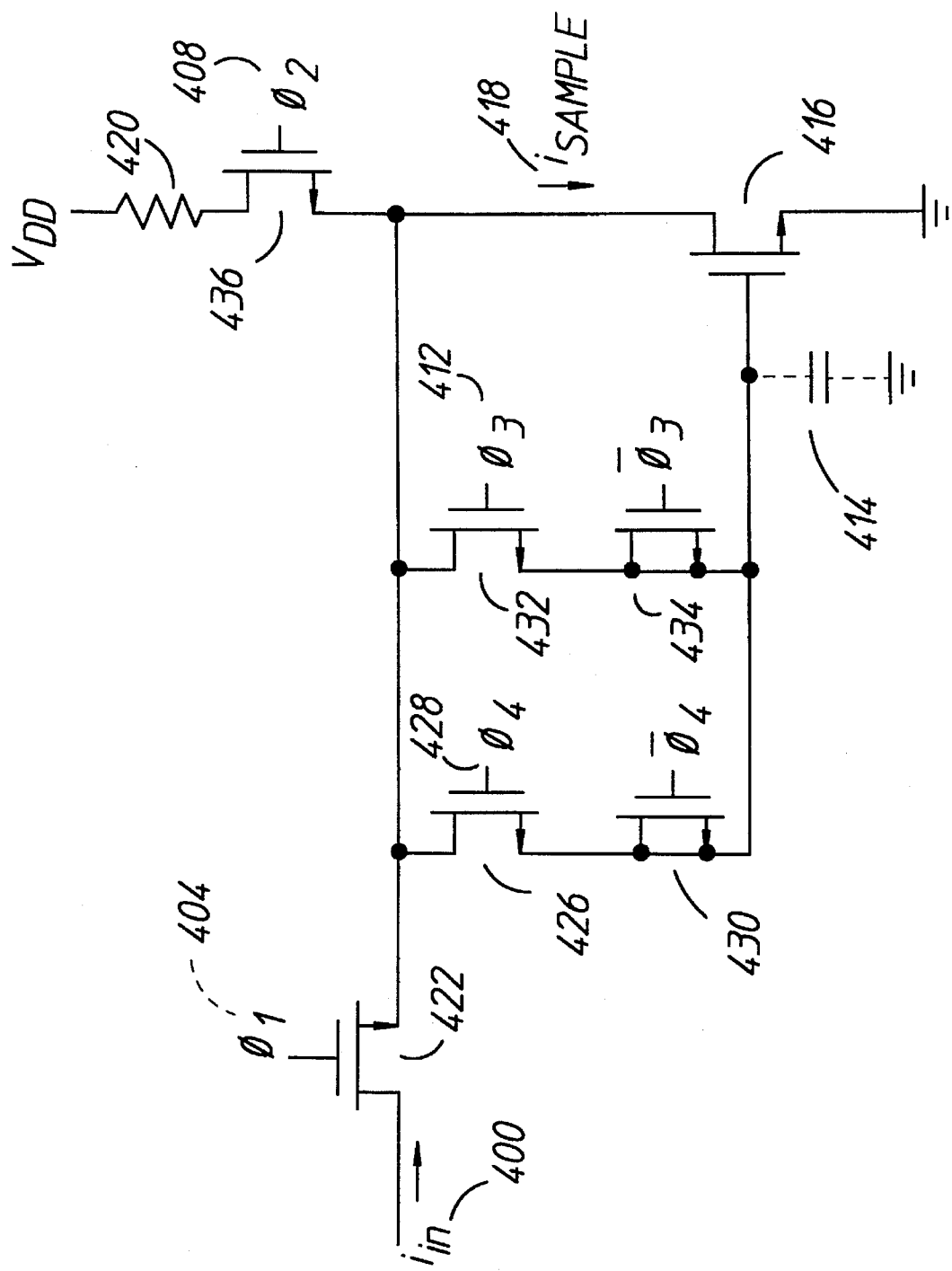
FIG. 4B is a schematic of a example embodiment of the switching circuit of FIG. 4A with a dual switch arrangement in accordance with the present invention.

FIG. 4B illustrates an example embodiment using the parallel switch arrangement of FIG. 2A combined with the charge cancellation arrangement of FIG. 1B in a current sampling circuit as illustrated in FIG. 4A. In FIG. 4B transistors 422, 426 and 432 are initially on and transistors 430, 434 and 436 are off. Assume for purposes of illustration that transistor 432 is much larger than transistor 426. After sufficient time for gate capacitance 414 to charge to a steady state voltage, transistor 432 is turned off and transistor 434 is turned on. Transistor 426 remains on long enough to compensate for residual charge from transistor 430 contaminating capacitor 414. Then transistor 426 is turned off and transistor 430 turned on, leaving a charge on the gate capacitance 414. Then, transistor 422 is turned off and transistor 436 is turned on, enabling current 418 to flow through transistor 436 with a magnitude equal to the input current 400. The circuit can be made fast by making transistor 432 large. The effects of uncancelled charge from transistor 432 are minimized by making transistor 426 much smaller than transistor 432.

Figure 5A:
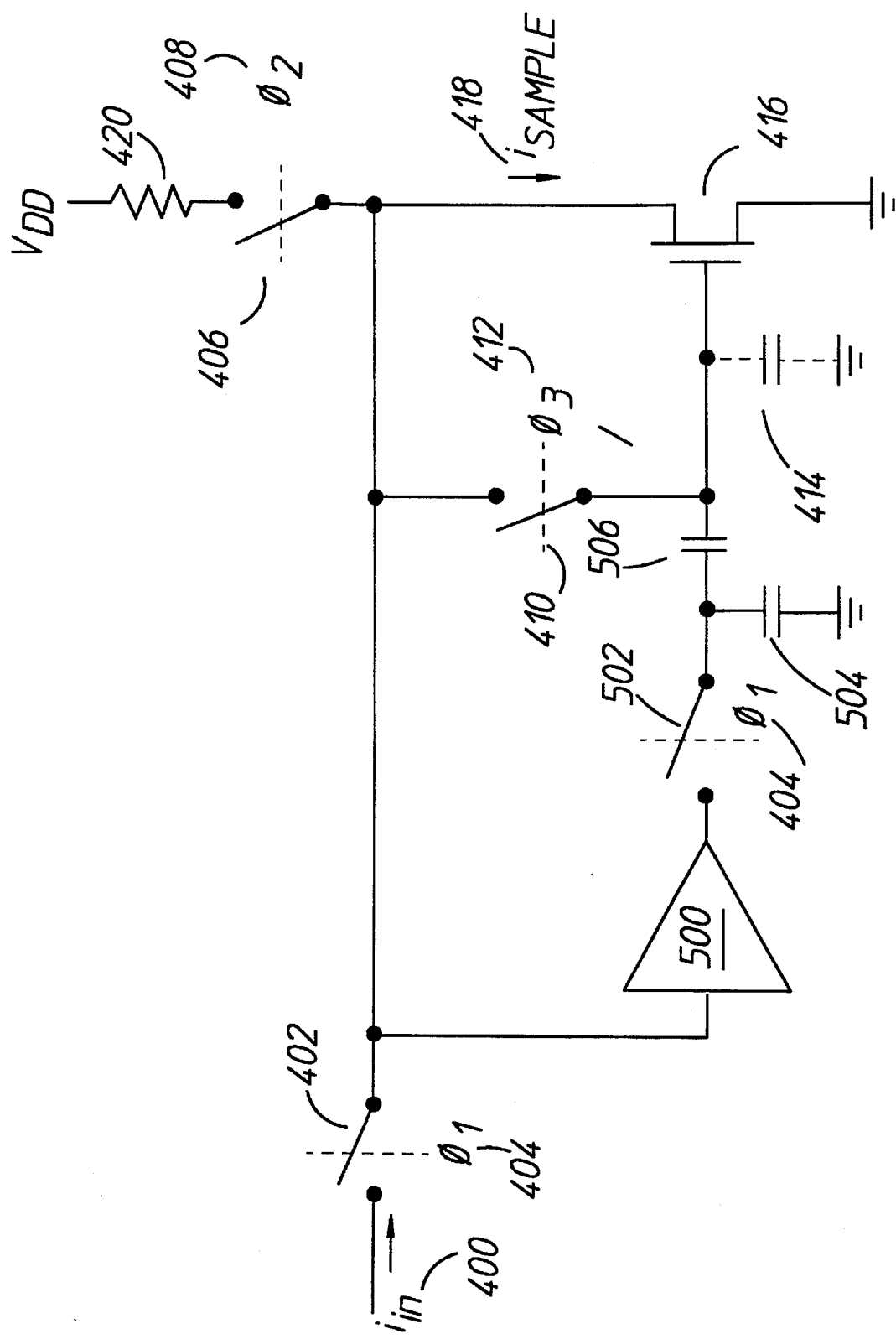
FIG. 5A is a simplified schematic of the switching circuit of FIG. 4A with the addition of an amplifier for additional precision.

FIG. 5A is a simplified schematic of the current sampling circuit of FIG. 4A with the addition of a feedback amplifier arrangement. The feedback amplifier circuit improves precision by holding the storage capacitance to a precise voltage while the sample switch is opened. In FIG. 5A, switch 410 opens before switches 402 and 502 open. Amplifier 500 helps hold the storage capacitance 414 at a constant voltage when switch 410 opens, thereby reducing the effects of charge contamination from switch 410. In addition, the amplifier 500 provides a low impedance output node which results in a much shorter settling time for voltages on capacitors 504, 506 and 414. When the feedback loop is broken (when switch 502 opens), some residual channel charge from switch 502 is dumped onto capacitor 504. The resulting voltage on capacitor 414 is approximately as follows, where $V_{504}$ is the voltage across capacitor 504 and $Q_{502}$ is the channel charge from switch 502:

$$V_{414} = V_{504} * \frac{C_{506}}{C_{506} + C_{414}} = \frac{Q_{502}}{C_{504}} * \frac{C_{506}}{C_{506} + C_{414}}$$

From the above equation, note that the voltage on capacitor 414 resulting from opening switch 502 may be minimized by making capacitor 506 relatively small, capacitor 504 relatively large, and capacitor 414 relatively large.

The amplifier arrangement illustrated in FIG. 5A provides first order charge cancellation. However, opening switch 410 creates a small transient in the feedback system due to residual charges, and the feedback loop requires some time to restabilize after the transient. This stabilization time limits the sample rate of the circuit because switches 402 and 502 cannot be opened until the feedback amplifier loop restabilizes after switch 410 opens. The residual charge from switch 410 can be reduced by using a dual switch arrangement as illustrated in FIG. 4B for switch 410 in FIG. 5A.

Figure 5B:
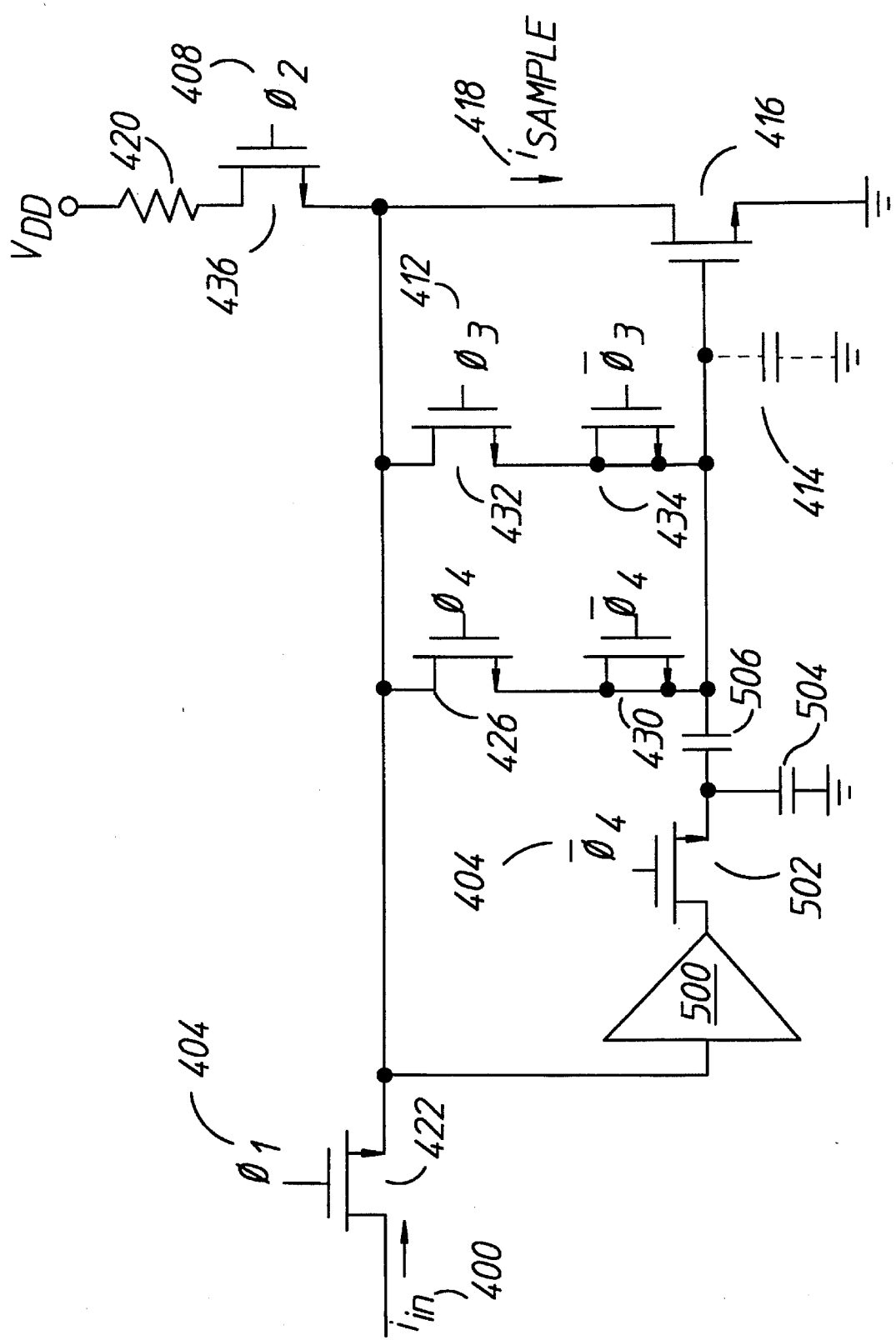
FIG. 5B is a simplified schematic of the switching circuit of FIG. 4A with the addition of a dual switching arrangement as in FIG. 4B.

FIG. 5B illustrates the current sampling circuit of FIG. 5A improved by a dual switch arrangement as illustrated in FIG. 4B for switch 410 in FIG. 5A. The dual switch arrangement increases the sample rate significantly because the smaller charge contamination from switch 426 results in a shorter stabilization time for the feedback amplifier circuit.

FIG. 5C illustrates the timing of the various switching signals discussed in conjunction with FIG. 5B. At time T1 (500), switches 422, 502, 426 and 432 all close so that capacitor 414 is rapidly charged and the input current 400 flows through the current sink 416. At time T2 (502), large switch 432 opens. At time T3 (504), small switch 426 opens, adding or subtracting a relatively small residual charge onto capacitor 414 and creating a small transient in the feedback amplifier loop. At time T4 (506), after the amplifier loop has stabilized, switches 422 and 502 open and switch 436 closes, the charge on capacitor 414 maintaining a current $i_{SAMPLE}$ (418) through resistor 420 and current sink 416 equal to the sampled current $i_{IN}$ (400) until time T5 (508). At time T5 (508), the cycle starts over for a new current sample.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electronic circuit for switching a signal voltage to a storage capacitance, the electronic circuit comprising:

a first switch having a first switch residual charge after opening, the first switch being connected between the signal voltage and the storage capacitance, the first switch comprising a first MOS switch transistor and a first dummy MOS transistor, connected in series with the first MOS switch transistor, the first dummy MOS transistor being half the size of the first MOS switch transistor, the first dummy MOS transistor having a first dummy MOS transistor source and a first dummy MOS transistor drain, the first dummy MOS transistor source shorted to the first dummy MOS transistor drain;

a second switch comprised of MOS transistors and having a second switch residual charge after opening, the second switch being connected between the signal voltage and the storage capacitance, the second switch being smaller than the first switch, the second switch residual charge thereby being less than the first switch residual charge; and the second switch being controlled to open after the first switch is controlled to open, thereby eliminating the effect of the first switch residual charge on the storage capacitance and leaving only the effect of the second switch residual charge on the storage capacitance.

2. The electronic circuit of claim 1, the second switch further comprising:

a second MOS switch transistor; and a second dummy MOS transistor, connected in series with the second MOS switch transistor, the second dummy MOS transistor being half the size of the second MOS switch transistor, the second dummy MOS transistor having a second dummy MOS transistor source and a second dummy MOS transistor drain, the second dummy MOS transistor source shorted to the second dummy MOS transistor drain.

3. An electronic circuit for copying a current signal to a current sink, the current sink having a control terminal such that a voltage at the control terminal determines the magnitude of current through the current sink, the electronic circuit comprising:

a first switch having a first switch input and a first switch output, the first switch input connected to the current signal, the first switch output connected to the current sink;

a power supply current source;

a second switch connected between the power supply current source and the current sink;

a third switch connected between the first switch output and the control node of the current sink, the third switch having a third switch residual charge after opening;

a fourth switch, smaller than the third switch, connected between the first switch output and the control node of the current sink, the fourth switch having a fourth switch residual charge after opening; and the third switch turning off before the fourth switch, thereby eliminating the effect of the third switch residual charge on the control node of the current sink and leaving only the effect of the fourth switch residual charge on the control node of the current sink.

4. The electronic circuit of claim 3, the third and fourth switches comprising MOS transistors.

5. The electronic circuit of claim 3, the third switch further comprising:

a first MOS switch transistor; and a first dummy MOS transistor, connected in series with the first MOS switch transistor, the first dummy MOS transistor being half the size of the first MOS switch transistor, the first dummy MOS transistor having a first dummy MOS transistor source and a first dummy MOS transistor drain, the first dummy MOS transistor source shorted to the first dummy MOS transistor drain.

6. The electronic circuit of claim 5, the fourth switch further comprising:

a second MOS switch transistor; and a second dummy MOS transistor, connected in series with the second MOS switch transistor, the second dummy MOS transistor being half the size of the second MOS switch transistor, the second dummy MOS transistor having a second dummy MOS transistor source and a second dummy MOS transistor drain, the second dummy MOS transistor source shorted to the second dummy MOS transistor drain.

* * * * *